United States Patent
Cuplin et al.

(10) Patent No.: US 6,894,477 B1
(45) Date of Patent: May 17, 2005

(54) ELECTRICAL CURRENT MONITOR

(75) Inventors: Richard P. Cuplin, Canton, MI (US); Ronald J. Tejero, Farmington Hills, MI (US)

(73) Assignee: Fazaki North America, Inc., Canton, MI (US)

( * ) Notice: Subject to any disclaimer, the term of this patent is extended or adjusted under 35 U.S.C. 154(b) by 254 days.

(21) Appl. No.: 10/379,485

(22) Filed: Mar. 4, 2003

(51) Int. Cl.⁷ .............................................. G01R 33/00
(52) U.S. Cl. .................................. 324/117 R; 324/765
(58) Field of Search .......................... 324/117 R, 117 H, 324/763, 765, 767, 768, 769, 158.1; 323/312, 302

(56) References Cited

U.S. PATENT DOCUMENTS

| | | | |
|---|---|---|---|
| 4,243,931 A | * | 1/1981 | dela Cruz ................. 323/302 |
| 4,631,474 A | | 12/1986 | Dolland |
| 5,039,941 A | * | 8/1991 | Castro ...................... 324/765 |
| 5,210,475 A | | 5/1993 | Juzswik et al. |
| 5,483,173 A | * | 1/1996 | Pellegrini ................. 324/765 |
| 5,495,155 A | | 2/1996 | Juzswik et al. |
| 5,519,341 A | | 5/1996 | Corsi et al. |
| 5,656,897 A | | 8/1997 | Carobolante et al. |
| 5,764,466 A | | 6/1998 | Mangtani et al. |
| 5,828,200 A | | 10/1998 | Ligman et al. |
| 5,909,109 A | | 6/1999 | Phillips |
| 6,337,591 B1 | | 1/2002 | Maggiolino |
| 6,392,392 B1 | * | 5/2002 | Nakahara ................. 323/312 |

* cited by examiner

*Primary Examiner*—David Zarneke
*Assistant Examiner*—Tung X. Nguyen
(74) *Attorney, Agent, or Firm*—Rader, Fishman & Grauer PLLC

(57) ABSTRACT

An electrical current monitor for monitoring a first current within an application. Comprising the electrical current monitor is an amplification circuit, including a first operational amplifier, and a current mirror circuit, including a second operational amplifier. With respect to their power supplies, both operational amplifiers are pseudo-grounded.

15 Claims, 3 Drawing Sheets

ELECTRICAL CURRENT MONITOR

FIELD OF THE INVENTION

The present invention relates generally to an electrical circuit and method for monitoring an electric current, and, more specifically, to a circuit and method for monitoring an electric current within a high voltage application without the need to attenuate the current signal to protect the circuit from excessive voltage.

BACKGROUND OF THE INVENTION

Accurate and precise monitoring of current flow allows the operational state of a circuit to be assessed and the presence of malfunctions to be detected. This is especially useful for circuits that may be powering/controlling more than one device or load. Current will continue to flow through the circuit upon one of the loads malfunctioning. However, the amount of current flowing through the circuit may fluctuate or change due to the malfunctioning load. As such, accurate monitoring of the current flowing through the circuit can reveal the presence of a malfunction. For illustrative purposes, consider the following example, where the function of an automotive circuit is to power all the exterior lights located at the rear of the automobile, such as the left, right and center brake light, along with the turn signal lights. If the left brake light were to malfunction and subsequently act as an open or shorter load, the amount of current flowing through the automotive circuit will fluctuate or change. Through the use of an accurate current monitor, this current change can be detected, alerting the system to the malfunctioning left brake light.

A known current monitoring circuit 5 is depicted in FIG. 1. According to this typical current monitor, a sense resistance $R_{sense}$ is placed in series with and between the power supply $V_{bat}$ and load 10. As such, the current going to the load ("load current") passes through resistance $R_{sense}$, which in turn generates a voltage drop across $R_{sense}$. By then measuring the voltage drop across the resistance $R_{sense}$, the load current can be determined.

As the current monitor 5 is directly connected to the application being monitored, the operational amplifiers OP1 and OP2 that comprise current monitor 5 must be able to accept input voltages up to the magnitude of power supply $V_{bat}$ of the application. Therefore, as the voltage level of power supply $V_{bat}$ increases, so must the maximum input voltage of the operational amplifiers OP1 and OP2. Traditional operational amplifiers are only rated to handle a maximum input voltage of 20–30 volts. Consequently, complications arise when typical current monitors, such as that depicted in FIG. 1, are utilized in applications that employ higher voltage power supplies, such as, for example, a 42 V power supply, as common operational amplifiers are not rated to handle these higher voltage levels.

In order to protect the current monitor circuit from excessive voltages, and more specifically, the operational amplifier within the circuit that initially accepts the input signal, it has been necessary to attenuate the input signal to current monitor 5. Attenuation of the input signal is accomplished by an attenuation stage 20, which, as illustrated in FIG. 1, consists of operational amplifiers OP1 and resistors R1–R4 arranged into a differential amplifier configuration. In typical differential amplifiers, the value of resistor R1 equals R3 and the value of resistor R2 equals R4. The differential "amplifier" can be configured to attenuate a signal (as opposed to amplifying it) by choosing values for the resistors such that R1 is greater than R2. In this configuration, the differential amplifier attenuates the input voltages to operable levels before they are applied to the first operational amplifier OP1 within the current monitoring circuit. This technique allows traditional current monitors to be used to monitor circuits that operate at higher voltage levels than those rated for typical operational amplifiers.

After attenuating the signal in order to protect the first operational amplifier within the circuit, current monitor 5 amplifies the signal by means of amplification stage 30. This is necessary as resistance $R_{sense}$ is designed to be relatively small in value in order to minimize the amount of power lost or dissipated by the current monitor 5. Thus, while voltage V2 and voltage V1 may be quite high in value, the actual voltage drop across resistance $R_{sense}$ may be quite small. Consequently, the differential voltage applied to operational amplifier OP1, which is equivalent to V2–V1, can be difficult to accurately measure and translate into a current value. To compensate for this small voltage differential, the output voltage $V_{outA}$ of attenuation stage 20 is fed into amplification stage 30, thereby allowing for an accurate translation of the voltage value into a current value.

The problem that arises with traditional current monitors such as the one described above and depicted in FIG. 1 is that corresponding resistors within the circuit, i.e. R1 and R3, must precisely match in value. If these resistor values are not precisely matched, the voltage levels applied to operational amplifier OP1 will not accurately represent the voltage drop across resistance $R_{sense}$. This leads to the common mode gain of the differential amplifier becoming significant in value and overwhelming the sought after voltage difference measured across resistance $R_{sense}$. As a result, accurate current detection becomes impossible. Thus, it is required that corresponding resistors, such as R1 and R3, not vary from one another by even 0.1% of their rated value, otherwise a useable voltage signal indicative of the current flow through $R_{sense}$ is often unobtainable.

Accordingly, for the above-described current monitoring circuit to work properly with a high voltage application, resistors within the attenuation stage must be precisely matched in value. As a result, significant time and expense is required to obtain resistor pairs that match to the degree of precision required by the attenuation stage of the circuit.

Therefore, the inventors hereof have recognized the need for a new circuit and method for monitoring an electrical current within an application.

SUMMARY OF THE INVENTION

The present invention relates to a new circuit and method for monitoring an electrical current. In particular, the inventive circuit comprises an amplification stage, including a first operational amplifier, and a current mirror stage, including a second operational amplifier. Both operational amplifiers are pseudo-grounded with respect to their power supplies.

DESCRIPTION OF THE PREFERRED EMBODIMENT

Figure 1:
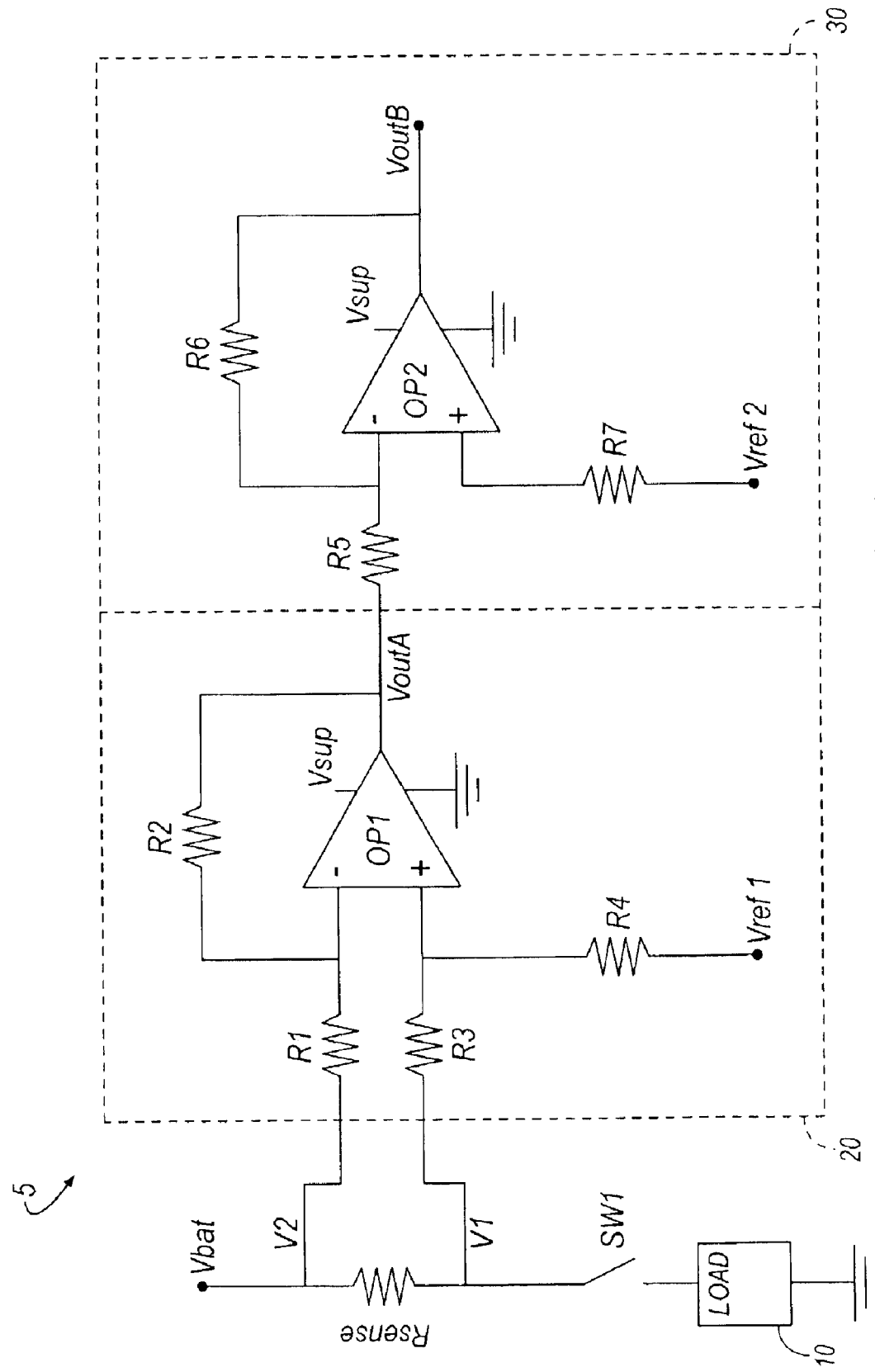
FIG. 1 is a circuit diagram that illustrates a prior art implementation of a current monitor.
Figure 2:
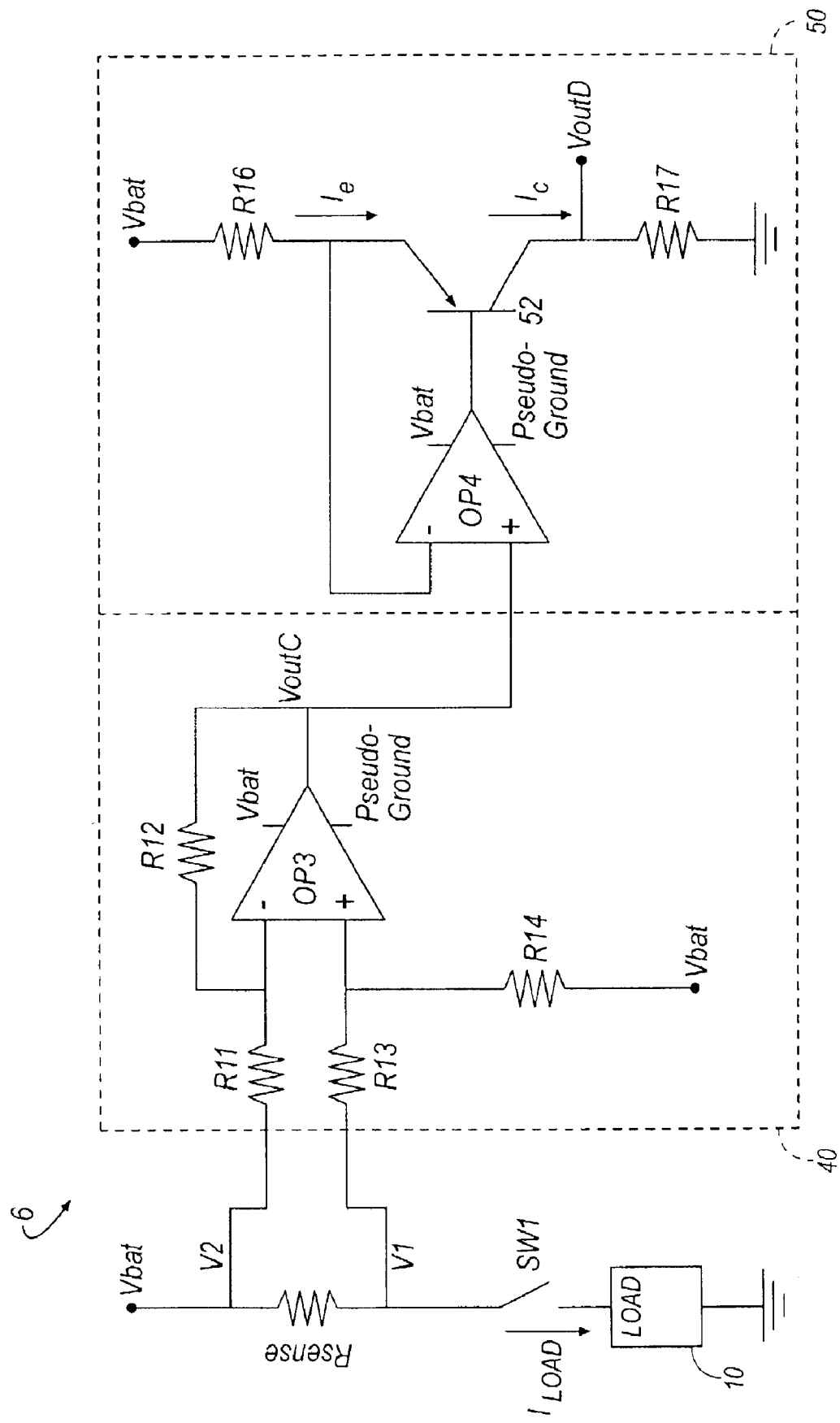
FIG. 2 is a circuit diagram that illustrates an exemplary embodiment of the present invention.

FIG. 2 illustrates one embodiment of an electrical current monitoring circuit in accordance with the present invention.

Connected between power supply $V_{bat}$ and load 10 are a resistance $R_{sense}$, and a switch SW1 for selectively opening and closing the application or circuit being monitored. When switch SW1 is closed, an electrical current $I_{Load}$ flows from the power supply $V_{bat}$, through resistance $R_{sense}$, to the load 10.

The current monitor 6, which attaches to the circuit path through which current $I_{Load}$ flows, is made up of an amplifier stage 40 and current mirror stage 50. Amplifier stage 40 comprises an operational amplifier OP3 and resistances R11–R14 arranged into a differential amplifier configuration. To function as a differential amplifier, the resistance values of amplifier stage 40 are preferably set so that resistance R11 equals R13 and resistance R12 equals R14. Additionally, the values of R12 and R11 should be set so that R12 is greater than R11 so as to amplify the input voltages. As a result of this R12/R11 resistance ratio, the differential amplifier will amplify, instead of attenuate, the voltage difference measured across resistance $R_{sense}$ and applied to amplifier stage 40.

Current mirror stage 50 comprises an operational amplifier OP4, transistor 52, and resistances R16 and R17 as illustrated in FIG. 2. The output of operational amplifier OP4 is connected to the base of transistor 52, while the collector and emitter of transistor 52 are wired, respectively, to resistances R16 and R17. This configuration creates a circuit path between resistances R16 and R17, thereby allowing current to flow from power supply $V_{bat}$ to a lower voltage point further down the path, such as, for example, to ground, as depicted in FIG. 2.

Instead of being powered at voltage levels set relative to ground, operational amplifiers OP3 and OP4 are powered relative to an established "pseudo-ground." This pseudo-ground, sometimes referred to as a "false ground" or "floating ground", is the application of a different reference voltage than ground. To illustrate this point, consider the following example, where, instead of a circuit component that is powered by the application of 5 volts above a ground reference, the component is powered by a 45 volt source above a 40 volt reference voltage. By employing the use of a pseudo-ground in the current monitoring circuit of the present embodiment, operational amplifiers OP3 and OP4 can be powered at higher voltage levels, such as that provided by power supply $V_{bat}$. The voltage level of the pseudo-ground is set to a value below that of its respective power supply, such as, for example, 5 volts below $V_{bat}$ as depicted in FIG. 2. Based on this example, if $V_{bat}$ were then rated for 42 volts, the pseudo-ground would be set at around 37 volts.

Figure 3:
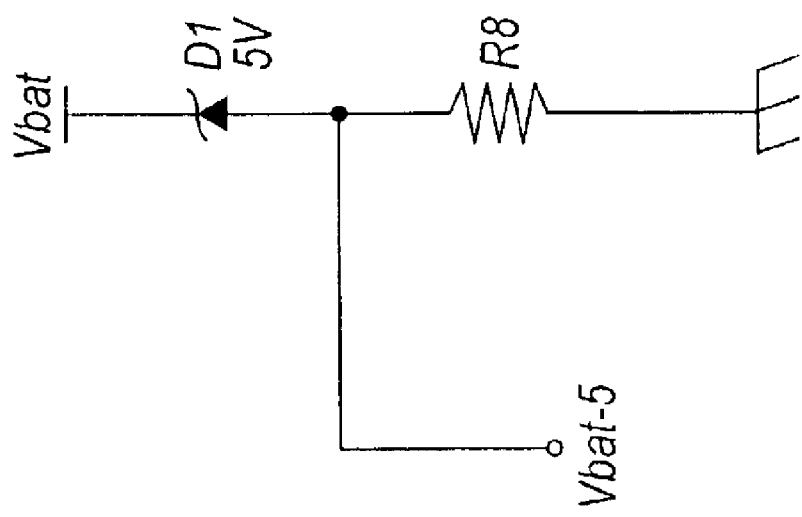
FIG. 3 is a circuit diagram that illustrates one example of how to establish a pseudo-ground point of reference.

The pseudo-ground may be established in any manner known in the electrical arts. One such manner, provided for illustrative purposes, involves the use of a zener diode as shown in FIG. 3. The zener diode functions as a voltage regulator, exhibiting a voltage drop that is almost constant and independent of the current through the diode. In this manner, a pseudo-ground may effectively be established at a predetermined voltage level below that of the corresponding power source simply by selecting the appropriate zener diode. An alternative example, also provided for illustrative purposes, may involve the use of a device such as a three-terminal negative voltage regulator to establish a pseudo-ground.

Now, the operation of the illustrated embodiment of the current monitor 6 will be described in greater detail. Resistance $R_{sense}$ is placed in series with the circuit path running between power supply $V_{bat}$ and load 10 of an application. Upon the closure of switch SW1, the circuit path is complete and electrical current $I_{Load}$ begins to flow from power supply $V_{bat}$ to load 10, through resistance $R_{sense}$. As long as electrical current $I_{Load}$ continues to flow, a voltage drop is established across resistance $R_{sense}$. As illustrated in FIG. 2, the voltage drop across $R_{sense}$ can be defined as V2–V1, where V2 is essentially equal to the voltage level of power supply $V_{bat}$ and V1 is the resultant lower voltage level due to the effects of resistance $R_{sense}$. By accurately determining the voltage drop V2–V1 across resistance $R_{sense}$, and knowing the resistance value of $R_{sense}$, electrical current $I_{Load}$ can be calculated based upon the relationship $I_{Load}=(V2-V1)/R_{sense}$.

To determine the voltage across resistance $R_{sense}$ (V2–V1), the current monitor 6 of the present embodiment attaches to the circuit node on each side of resistance $R_{sense}$. Voltages V2 and V1 become the input signals to amplification stage 40, where operational amplifier OP3 and resistances R11–R14 comprise a differential amplifier. Unlike prior electrical current monitoring circuits, no attenuation of the input signal is necessary due to the manner in which the operational amplifiers, i.e. OP3 and OP4 of FIG. 2, are configured to receive power. As previously discussed, operational amplifiers OP3 and OP4 are powered at a voltage level above an established pseudo-ground or reference level, instead of a true ground or null voltage level. As a result, the operational amplifiers are capable of accepting higher voltage input signals than if they were simply powered at voltage levels referenced to ground. Consequently, an attenuation stage is no longer required for the current monitoring circuit of the present embodiment.

Voltages V2 and V1 are input into amplification stage 40, which comprises a differential amplifier. The differential amplifier circuit responds to the input voltages by producing an output that is in proportion to the difference signal V2–V1, while rejecting common-mode signals (that is, produce zero output when V2 equals V1). For illustrative purposes, consider the following example where power supply $V_{bat}$ is rated at 42 volts. Consequently, voltage V2 is equal to 42 volts. Assume that due to the effects of resistance $R_{sense}$, voltage V1 is equal to 41.9 volts. Voltages V2 and V1 are applied to amplification stage 40, whereupon the differential voltage, equal to 0.1 volts in this example, is amplified and then presented as the output voltage $V_{outC}$ of the amplification stage 40. Voltages much higher than 42 volts are possible with this scheme. Applications in electric cars with voltages up to 1000 volts can be accommodated.

In its present form, the high voltage signal $V_{outC}$ may be unusable by some circuits that reference all of their voltage levels to a standard ground potential instead of a higher voltage level pseudo-ground potential used by operational amplifiers OP3. As such, signal $V_{outC}$ is converted to a more "circuit-friendly" electrical voltage signal. This is accomplished by the addition of current mirror stage 50 that is comprised of operational amplifier OP4. Current mirror stage 50 uses the voltage signal $V_{outC}$ to control the operating state of transistor 52. Depending on the strength of signal $V_{outC}$, transistor 52 will be placed into a state that can range from fully "on", thereby allowing a maximum amount of current Ie to pass through transistor 52, to fully "off", thereby essentially halting the flow of current Ie.

Current Ie originates from power supply $V_{bat}$, flows to the emitter side of transistor 52, through transistor 52 depending on its operating state, to the collector side of transistor 52 (now labeled as current Ic). The amount of current Ie (Ic) that flows from power supply $V_{bat}$ to ground is determined by the size of resistance R16. The larger the size of this resistance, the smaller the amount of current. Accordingly, resistance R16 may be chosen so that current Ie (Ic) and the corresponding voltage across R17 is of a magnitude that can be managed by lower voltage circuits. The value of resistance R16 and $V_{outC}$ determines the current and that current is mirrored to flow in resistance R17.

Once current Ic passes from transistor 52, it continues on through resistance R17, subsequently generating a voltage $V_{outD}$ as the output signal of current monitor circuit 6. Furthermore, as the output signal $V_{outD}$ is generated in reference to a standard ground potential, it can be readily utilized by circuits that operate at lower voltages or rely on ground potential as their reference voltage level. Transistor 52 can be bipolar or can be a FET and is the only component in the scheme that must be rated for the high voltage of the application (be it 42 volts or 1000 volts). Transistors with these voltage ratings are readily available.

Several benefits are obtained through the use of an electric current monitoring circuit as presented above. Unlike traditional current monitors, the monitoring circuit of the present invention can receive input voltage levels that would normally be considered to be harmful to traditional current monitoring circuits. Specifically, by powering the operational amplifiers of the current monitor circuit at voltage levels referenced to a pseudo-ground potential, the circuit can be subjected to higher input voltages without the need for attenuation. Furthermore, by eliminating the need to attenuate the incoming signal, the voltages representing the sense current throughout the current monitoring circuit are significantly greater in value. The higher voltage levels can better accommodate noise, variations in manufacturing tolerances of the components, and other undesirable fluctuations in the signaling voltages without adversely affecting the ultimate output of the current monitoring circuit. Specifically, unlike prior current monitoring circuits that require corresponding resistances within a differential amplifier to precisely match in value to the order of 0.1%, the present invention permits a wider range of tolerance between corresponding resistances, such as, for example, allowing corresponding resistance values to deviate from one another by 1%. By increasing the allowable amount of deviation between corresponding resistances by an order of magnitude, less time, effort and expense has to be allocated toward the acquisition of matching resistances. Alternatively, if greater accuracy in electric current monitoring is desired, the same level of tolerance between corresponding resistances can remain as required in prior methods. In this situation, the benefits of the present invention would then be seen as increased accuracy in the monitoring of electric current.

While this invention has been specifically described in connection with certain specific embodiments thereof, it is to be understood that this is by way of illustration and not of limitation, and the scope of the appended claims should be construed as broadly as the prior art will permit.

What is claimed is:

1. An electrical current monitor for monitoring a first current within an application, comprising:
    an amplification circuit, including a first operational amplifier, that generates a first output voltage indicative of said first current; and
    a current mirror circuit, including a second operational amplifier, that is responsive to said first output voltage and which controls a second current flow based upon said first output voltage;
    wherein said first operational amplifier and said second operational amplifier are pseudo-grounded with respect to their power supplies.

2. The electrical current monitor according to claim 1, wherein said amplification circuit comprises a differential amplifier.

3. The electrical current monitor according to claim 1, wherein said current mirror circuit further includes a transistor connected to said second operational amplifier.

4. The electrical current monitor according to claim 1, wherein said first current represents a load current of said application.

5. The electrical current monitor according to claim 1, wherein said pseudo-ground is established by a zener diode.

6. The electrical current monitor according to claim 1, wherein said pseudo-ground is established by a voltage regulator.

7. An electrical current monitor for monitoring a first current within an application, comprising:
    a first resistance through which flows said first current;
    a first operational amplifier for detecting a first voltage existing across said first resistance and generating a second voltage that is representative of said first voltage; and
    a second operational amplifier for controlling a flow of a second current based upon said second voltage;
    wherein both said first operational amplifier and said second operational amplifier are pseudo-grounded with respect to their power source.

8. The electrical current monitor according to claim 7, wherein said pseudo-ground is established by a zener diode.

9. The electrical current monitor according to claim 7, wherein said pseudo-ground is established by a voltage regulator.

10. The electrical current monitor according to claim 7, wherein said first operational amplifier is part of a differential amplifier.

11. The electrical current monitor according to claim 7, further comprising a transistor connected to an output of said second operational amplifier.

12. The electrical current monitor according to claim 7, further comprising a second resistance through which flows said second current, thereby generating a third voltage across said second resistance that is representative of said first current.

13. The electrical current monitor according to claim 7, wherein said first voltage is obtained from a high voltage application while said third voltage is useable by lower voltage circuits.

14. A method of monitoring a first electrical current signal within an application, comprising the steps of:
    establishing a voltage signal by passing said first electrical current signal through a resistance;
    amplifying said voltage signal with an amplifier that is pseudo-grounded with respect to its power supply;
    supplying said amplified voltage signal to an input of an operational amplifier that is pseudo-grounded with respect to its power supply; and
    establishing a second electrical current signal that is representative of said voltage signal by means of said operational amplifier.

15. The method of monitoring an electrical current according to claim 14, further comprising the step of isolating and retrieving said voltage signal from a common mode voltage.

* * * * *

UNITED STATES PATENT AND TRADEMARK OFFICE
CERTIFICATE OF CORRECTION

PATENT NO. : 6,894,477 B1
DATED : May 17, 2005
INVENTOR(S) : Richard P. Cuplin et al.

It is certified that error appears in the above-identified patent and that said Letters Patent is hereby corrected as shown below:

<u>Title page,</u>
Item [73], Assignee, "Fazaki North America, Inc." should read -- Yazaki North America, Inc. --.

Signed and Sealed this

Sixteenth Day of August, 2005

JON W. DUDAS
*Director of the United States Patent and Trademark Office*